(12) United States Patent
Ghosh et al.

(10) Patent No.: US 11,058,039 B2
(45) Date of Patent: Jul. 6, 2021

(54) COMPOSITES FOR HIGH FREQUENCY ELECTROMAGNETIC INTERFERENCE (EMI) APPLICATIONS

(71) Applicant: 3M INNOVATIVE PROPERTIES COMPANY, St. Paul, MN (US)

(72) Inventors: Dipankar Ghosh, Oakdale, MN (US); Jitendra S. Rathore, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/063,625

(22) PCT Filed: Dec. 9, 2016

(86) PCT No.: PCT/US2016/065916
§ 371 (c)(1),
(2) Date: Jun. 18, 2018

(87) PCT Pub. No.: WO2017/116656
PCT Pub. Date: Jul. 6, 2017

(65) Prior Publication Data
US 2018/0376628 A1      Dec. 27, 2018

Related U.S. Application Data

(60) Provisional application No. 62/272,418, filed on Dec. 29, 2015.

(51) Int. Cl.
*H05K 9/00*      (2006.01)
*H01B 1/22*      (2006.01)
(Continued)

(52) U.S. Cl.
CPC ........... *H05K 9/0083* (2013.01); *C08K 3/041* (2017.05); *H01B 1/22* (2013.01); *H01B 1/24* (2013.01);
(Continued)

(58) Field of Classification Search
CPC .. H05K 9/0075; H05K 9/0083; C07F 7/0874; C08K 5/549; C08K 3/40; H01L 2924/3025
(Continued)

(56) References Cited

U.S. PATENT DOCUMENTS 3,433,780 A * 3/1969 Cekada, Jr. ........... C07F 7/0874
524/156
4,545,914 A    10/1985 Graiver
(Continued)

FOREIGN PATENT DOCUMENTS

EP        0558045      9/1993
JP      2006-213909    8/2006
(Continued)

OTHER PUBLICATIONS

Antoniadou, "Development of Conductive Polymer with Carbon Nanotubes for Regenerative Medicine Applications", 2010 Annual International Conference of The IEEE Engineering in Medicine and Biology Society: (EMBC 2010); Buenos Aires, Argentina, Aug. 31-Sep. 4, 2010, IEEE, Piscataway, NJ, USA, Aug. 31, 2010, pp. 815-818.
(Continued)

*Primary Examiner* — Khanh T Nguyen
(74) *Attorney, Agent, or Firm* — Yufeng Dong

(57) ABSTRACT

Electromagnetic interference (EMI) shielding articles and methods of producing and using the same are described. The articles include electrically conductive fillers and silsesquioxane-like (SSQ-like) particles distributed inside a poly-
(Continued)

meric matrix material. In some cases, adding the SSQ-like particles leads to increased porosity of the articles which improves EMI absorbing performance.

19 Claims, 3 Drawing Sheets

(51) Int. Cl.
  *H01B 1/24* (2006.01)
  *C08K 3/04* (2006.01)
(52) U.S. Cl.
  CPC ...... *H05K 9/009* (2013.01); *H01L 2924/3025* (2013.01)
(58) Field of Classification Search
  USPC .......... 174/391; 524/156; 399/320; 523/458
  See application file for complete search history.

(56) References Cited

U.S. PATENT DOCUMENTS

| | | | |
|---|---|---|---|
| 4,568,718 A | | 2/1986 | Huebner |
| 5,153,238 A | * | 10/1992 | Bilgrien ............... C08J 3/124 523/211 |
| 5,492,958 A | | 2/1996 | Haluska |
| 8,219,013 B2 | * | 7/2012 | Moorlag ............... C08K 5/549 399/320 |
| 8,325,079 B2 | | 12/2012 | Shah |
| 2002/0049274 A1 | | 4/2002 | Azechi |
| 2011/0216476 A1 | | 9/2011 | Fleischer |
| 2011/0297892 A1 | | 12/2011 | Shah |
| 2011/0317326 A1 | | 12/2011 | Onishi |
| 2013/0240261 A1 | * | 9/2013 | Song ............... H05K 9/0075 174/391 |
| 2014/0005304 A1 | * | 1/2014 | Suresh ............... C08K 3/40 523/458 |
| 2014/0320959 A1 | | 10/2014 | Jun et al. |

FOREIGN PATENT DOCUMENTS

| WO | WO 2004-090019 | 10/2004 |
|---|---|---|
| WO | WO 2011-109480 | 9/2011 |
| WO | WO 2012-040038 | 3/2012 |
| WO | WO 2013-154871 | 10/2013 |
| WO | WO 2013-184285 | 12/2013 |
| WO | WO 2014-003827 | 1/2014 |
| WO | WO 2014-099699 | 6/2014 |
| WO | WO 2014-130431 | 8/2014 |
| WO | WO 2015-094915 | 6/2015 |
| WO | WO 2016-200662 | 12/2016 |

OTHER PUBLICATIONS

Applied Nanostructured Solutions, LLC, PDF Fact Sheet, Aug. 26, 2014.
Kozako, "Effects of Nano-Alumina Hydrate Coating for Conductive Fillers on Dielectric Properties of Epoxy Composite Materials," Conference Proceedings of International Symposium on Electrical Insulating Materials (ISEIM), 2014, p. 77-80.
Li, "Dispersions of Carbon Nanotubes/Polyhedral Oligomeric Silsesquioxane hybrids in polymer: The Mechanical, Electrical and EMI Shielding Properties", Journal of Materials Science, Nov. 2010, vol. 46, No. 7, pp. 2324-2330.
Li, "High-k Polymer/Carbon Nanotube Composites Based on a Polyhedral Oligomeric Silsesquioxane Matrix Facilitated by Ionic Liquid," Journal of Materials Chemistry C, Materials for Optical and Electronic Devices, Aug. 2014, vol. 2, No. 39, pp. 8216-8221.
Sun, "Regulated Dielectric Loss of Polymer Composites from Coating Carbon Nanotubes with a Cross-Linked Silsesquioxane Shell through Free-Radical Polymerization," ACS Applied Materials and Interfaces, Nov. 2014, vol. 6, No. 21, pp. 18635-18643.
Yang, "Novel Carbon Nanotube-Polystyrene Foam Composites for Electromagnetic Interference Shielding" Nano Letters, Sep. 2005, vol. 5, No. 11, pp. 2131-2134.
Zhang, "Controlled Dielectric Properties of Polymer Composites from Coating Multiwalled Carbon Nanotubes with Octa-acrylate Silsesquioxane Through Diels-Alder Cycloaddition and Atom Transfer Radical Polymerization," Industrial & Engineering Chemistry Research, Apr. 2014, vol. 53, No. 16, pp. 6699-6707.
Zhang, "Polyhedral Oligomeric Silsesquioxane/ Carbon Nanotube/ Carbon Fiber Hierarchical Reinforcement on the Interfacial Properties," Applied Surface Science, Jun. 29, 2015, vol. 353, pp. 224-231.
International Search Report for PCT International Application No. PCT/US2016/065916, dated Mar. 9, 2017, 7 pages.

* cited by examiner

COMPOSITES FOR HIGH FREQUENCY ELECTROMAGNETIC INTERFERENCE (EMI) APPLICATIONS

CROSS REFERENCE TO RELATED APPLICATIONS

This application is a national stage filing under 35 U.S.C. 371 of PCT/US2016/065916, filed Dec. 9, 2016, which claims the benefit of U.S. Application No. 62/272,418, filed Dec. 29, 2015, the disclosure of which is incorporated by reference in its/their entirety herein.

TECHNICAL FIELD

The present disclosure relates to composites or articles for high frequency electromagnetic interference (EMI) applications and methods of making the same.

BACKGROUND

Electromagnetic interference (EMI) shielding of electronic devices and/or radiation sources is an important consideration in the reliable operation of devices. EMI shielding may be achieved by reflection of the electromagnetic (EM) wave, absorption of the wave, or both. It is most common for a highly conductive metal sheet (known as an EM shield) to be used to reflect undesired EM waves. However, in some cases, reflecting the EM waves is not sufficient or may cause further problems. This leads to the requirement for providing EMI absorber and shielding materials and methods for absorbing EM waves, especially in a high frequency regime, for example, 1-40 GHz or 1-100 GHz and harmonics associated with such base frequencies.

SUMMARY

Briefly, in one aspect, the present disclosure describes an electromagnetic interference (EMI) shielding article including electrically conductive fillers, silsesquioxane-like (SSQ-like) particles, and a polymeric matrix material. The electrically conductive fillers and the SSQ-like particles are distributed inside the polymeric matrix material. In some embodiments, the composition of the article includes about 25 wt. % or less, 15 wt. % or less, 5 wt. % or less, 3 wt. % or less, or 1 wt. % or less of the SSQ-like particles.

In another aspect, the present disclosure describes a method of making an EMI shielding article. The method includes providing electrically conductive fillers, providing silsesquioxane-like (SSQ-like) particles, and adding a mixture of the electrically conductive fillers and the SSQ-like particles into a polymeric matrix material. The electrically conductive fillers and the SSQ-like particles are distributed inside the polymeric matrix material. In some embodiments, the electrically conductive fillers include carbon nanostructure (CNS) fillers that include cross-linked carbon nanotubes.

Various unexpected results and advantages are obtained in exemplary embodiments of the disclosure. One such advantage of exemplary embodiments of the present disclosure is that by introduction of small amounts (e.g., about 25 wt. % or less, 15 wt. % or less, 5 wt. % or less, about 3 wt. % or less, about 1 wt. % or less, or even about 0.5 wt. % or less) of SSQ-like nanoparticles in the polymeric matrix, the EMI shielding articles exhibit superior EMI absorber performance.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
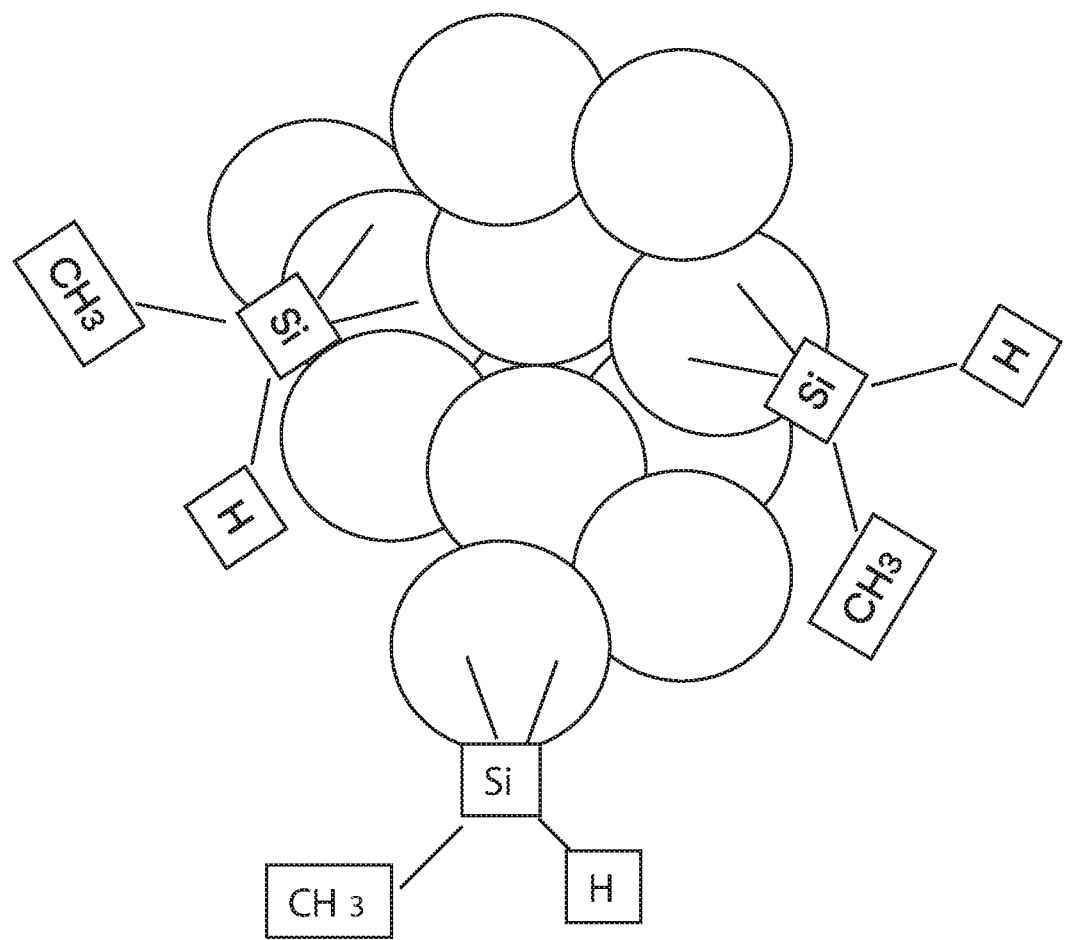
FIG. 1 illustrates a schematic model of a SSQ-like particle aggregate.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

The term "homogeneous" means exhibiting only a single phase of matter when observed at a macroscopic scale.

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

The term "carbon nanostructure" or "CNS" refers to carbon nanotubes (CNTs) that are organized in a cross-linked network.

The term "polymeric encapsulation material" refers to polymeric material that at least partially encapsulates CNTs.

The term "curable matrix material" refers to a polymeric material that can be thermally or optically cured, and after curing the polymeric material forms a cured polymeric body which serves as a matrix body to host fillers or additives embedded therein.

The term "silsesquioxane" or "SSQ" refers to an organic and inorganic hybrid which is characterized by the general formula $RSiO_{3/2}$ where R represents an organic substituent where the silicon atoms are connected together through the oxygen atoms with the R groups connected to the silicon atoms, and the Si—O groups provide the inorganic properties, while the R groups provide the organic properties.

The term "silsesquioxane-like" or "SSQ-like" particle refers an organic and inorganic hybrid which includes materials with general formula $(RHSiO)_n$—$(RSiO_{3/2})_m$ where R represents an organic substituent where the silicon atoms are connected together through the oxygen atoms with the R groups connected to the silicon atoms, and the Si—O groups provide the inorganic properties, while the R groups provide the organic properties.

The terms "about" or "approximately" with reference to a numerical value or a shape means+/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

The present disclosure describes electromagnetic interference (EMI) shielding articles having a composition including electrically conductive fillers, silsesquioxane-like (SSQ-like) particles, and a polymeric matrix material for distributing the fillers and the particles. In some embodiments, the composition is capable of absorbing at least a portion of the incoming electromagnetic (EM) energy in the base frequency range of 0.1-40 GHz and harmonics thereof. In some embodiments, the SSQ-like particles added in the composition are capable of increasing EM energy absorption of the composition by at least 5% in the base frequency range of 0.1-40 GHz and harmonics thereof as compared to a composition without the SSQ-like particles.

Carbon nanostructure (CNS) encapsulated flakes are a form of carbon nanotubes (CNTs) including cross-linked multiwall carbon nanotube-based networks of CNS. In some embodiments, carbon nanotubes of CNS encapsulated flakes can be compounded by various polymeric encapsulation materials such as, for example, polyurethane (PU), polyethylene glycol (PEG), polyamide (PA), etc. In CNS encapsulated flakes, carbon nanotubes can be at least partially encapsulated by one or more polymeric encapsulation materials. In some embodiments, about 50% or more, about 70% or more, about 90% or more, or about 95% or more of the surface area of cross-linked network of carbon nanotubes can be covered by the polymeric encapsulation material. In some embodiments, the CNS flakes can include, for example, about 1 wt. % to about 20 wt. %, about 2 wt. % to about 10 wt. %, or about 3 wt. % to about 5 wt. % of the polymeric encapsulation materials.

CNTs in the CNS encapsulated flakes can exhibit metallic or semiconducting behavior with an electrical resistivity in the range, for example, from about $1 \times 10^{-8}$ to about $1 \times 10^{-2}$ Ω-cm at room temperature. CNTs can have desirable electromagnetic absorption properties, for example, being capable of absorbing electromagnetic radiation and dissipating the absorbed energy in a host polymer matrix. The polymeric encapsulation material may be electrically insulating with an electrical resistivity in the range, for example, from about $1 \times 10^{2}$ to about $1 \times 10^{20}$ Ω-cm.

In some embodiments, CNS encapsulated flakes can be dispersed in a curable matrix material to form composites that may impart EMI absorbing properties from the CNTs dispersed therein. The formed composites may include, for example, about 0.05 to about 10 wt. %, about 0.1 to about 5 wt. %, or about 0.2 to about 2 wt. % of CNS fillers such as, for example, CNS encapsulated flakes or powders. The composites may include, for example, about 5 wt. % or less, about 3 wt. % or less, about 1 wt. % or less, or even about 0.5 wt. % or less of the CNS fillers to exhibit desired EMI absorbing properties. The curable matrix material can include, for example, epoxy, silicone, polycarbonate, polyester, polyurethane resin, etc. The curable matrix material can be cured by, for example, radiation or heating, to form a radiation cured polymeric body or a thermally cured polymeric body.

In some embodiments, CNS encapsulated flakes can have an average length from about 10 microns to about 500 microns, and an average thickness from about 1 micron to about 50 microns. In some embodiments, the CNS encapsulated flakes can be ground into fine powders before being dispersed in the curable matrix material to form EMI shielding composites. The CNS fine powders may have an average diameter in the range, for example, from about 0.1 micron to about 10 microns, or from about 0.5 microns to about 5 microns. It is to be understood that the grinding process may reduce the size of the particles without changing the CNS encapsulated structure at a microscopic scale.

In some embodiments described herein, EMI shielding composites can further include silsesquioxane-like (SSQ-like) particles. Exemplary silsesquioxane-like particles and the methods of making the same are described in WO 2014/003827 (Ratheore et al.), which is incorporated herein by reference. Silsesquioxane is an organic and inorganic hybrid. Silsesquioxane is characterized by the general formula $RSiO_{3/2}$ where R represents an organic substituent. The silicon atoms are connected together through the oxygen atoms with the R groups connected to the silicon atoms. The Si—O groups provide the inorganic properties, while the R groups provide the organic properties.

The silsesquioxane-like particles of the present disclosure can be derived from apolyhydrosiloxane and a water soluble base, which are contacted to form the particles of the present disclosure.

Polyhydrosiloxane is a polymer of the following formula:

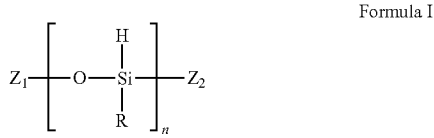

Formula I where $Z_1$ and $Z_2$ are endgroups; n is an integer greater than 2; and R is an organic group.

The endgroups of Formula I are derived from the starting materials used to make the polyhydrosiloxane. These endgroups are not particularly limited and can include, for example, an alkylated (linear, cyclic or branched) silane. Exemplary endgroups include: —Si(CH$_3$)$_3$, —Si(CH$_3$)$_2$H, —Si(CH$_3$)H$_2$, —Si(CH$_2$CH$_3$)$_3$, —Si(CH$_2$CH$_2$CH$_3$)$_3$, —Si(C(CH$_3$)$_3$)$_3$, —Si(CH$_2$CH(CH$_3$)CH$_3$)$_3$, and —Si(CH(CH$_3$)CH$_2$CH$_3$)$_3$.

The polyhydrosiloxane includes repeating units, where n is at least 2, 4, 5, 6, 8, 10, 25, 50, 75, 100, 150, or even 200; and at most 1000, 2500, 5000, 7500, 10000, or even 15000.

R is an organic group, which may be linear or branched, cyclic or acyclic, saturated or unsaturated. The organic group can include as few as 1, 2, 3, 4, 5, 6, 7, 8, or even 9 carbon atoms and as many as 15, 17, 20, 25, 30, or even 35 carbon atoms. As used herein "organic group" refers to a carbon-based group that is connected via a carbon atom. In one embodiment, the organic group may contain functional group(s) such as amine, ammonium, ether, ester, or urethane groups.

In one embodiment, the organic group is not substituted. In one embodiment the organic group is an alkyl group. Exemplary alkyl groups include, methyl, ethyl, propyl, butyl, octyl, and phenyl.

In another embodiment, the organic group is substituted (i.e., the organic group comprises at least one atom besides carbon and hydrogen). In one embodiment, the substituted organic group comprises at least one caternary heteroatom (e.g., O, S, and/or N), and/or halogen (e.g., Cl, Br, and/or I).

Exemplary organic groups include: methyl, ethyl, propyl, butyl, $C_6H_4Y$—, $C_6H_5(CH_2)$—, $C_6H_5(CH_2)$—, $C_6H_5(CHY)$—, and $C_6H_5(CY_2)$— where Y can be chloro, bromo, iodo, alkoxy, or a combination thereof, and allyl ($CH_2$=CH—R'—) and vinyl ($CH_2$=CR$^1$—) groups, wherein R$^1$ is a linear or branched alkyl group.

Exemplary polyhydrosiloxanes can include: polymethylhydrosiloxane, polyethylhydrosiloxane, polypropylhydrosiloxane, polybutylhydosiloxane, polybenzylhydrosiloxane, methylhydrogen cyclosiloxane, and combinations thereof.

The polyhydrosiloxanes may have a weight average molecular weight of at least 500, 1000, 1500, 1800, 2000, 2400, or even 2500 grams/mole; and at most 5000, 10000, 15000, 20000, 25000, 30000, or even 60000 grams/mole.

In some embodiments, the obtained SSQ-like particles can have an average particle size, for example, no less than about 5 nm, no less than 10 nm, or no less than 20 nm. In some embodiments, the SSQ-like particles can have an average particle size, for example, no greater than about one micron, no greater than 500 nm, no greater than 200 nm, or no greater than 100 nm. In some embodiments, the average size of the SSQ-like particles can be in the range, for example, from about 10 nm to about 500 nm.

In some embodiments, the SSQ-like particles can further agglomerate or tether together to form agglomerates or aggregates having an average size, for example, no less than about 500 nm, no less than one micron, or no less than 2 microns. The average size of the SSQ-like particle aggregates can be, for example, no greater than about 50 microns, no greater than 20 microns, no greater than 10 microns, or no greater than 5 microns. In some embodiments, the average size of the agglomerates or aggregates can be in the range from about one micron to about 10 microns. FIG. 1 illustrates an exemplary SSQ-like particle aggregate.

As shown in FIG. 1, when the SSQ-like particles of the present disclosure are aggregated, the substantially spherical particles are bonded together to form aggregates. Typically, the particles are catenated, meaning bonded together to form a string of particles. While not wanting to be bound by theory, it is believed that the particles are covalently bonded together through the reaction of a given polymer chain in two different distinct particles. Such aggregates may include at least two individual substantially spherical particles. In one embodiment, it is believed that this aggregation may lead to improved performance in some applications, such as in high strength composites. When the SSQ-like particles of the present disclosure are an aggregation of primary nanoparticle-sized particles, the maximum cross-sectional dimension of the aggregated particle can be, for example, greater than 10 nm, 100 nm, 200 nm, 500 nm, or even 1000 nm.

In some embodiments, the SSQ-like particles of the present disclosure have a high surface area. For example, at least 50, 200, 400 or even 500 m$^2$/g; and at most 1000, 1200, 1400, 1500, or even 1800 m$^2$/g based on BET (Brunauer Emmet Teller method) nitrogen adsorption.

In some embodiments the SSQ-like particles of the present disclosure are thermally stable meaning that they can be heated to temperatures of at least 120, 130, 140, 150, 160, 170, 180, or even 200° C.; and at most 250, 275, 300, 325, 350, 400, 500, 600, 700, or even 800° C. and achieve less than 15% weight loss.

In the present disclosure, by introduction of small amounts of SSQ-like nanoparticles in the polymer matrix, the EMI composites can exhibit superior EMI absorber performance (e.g., significantly reduced real part of permittivity values). The EMI shielding composites described herein can include, for example, about 0.005 wt. % to about 10 wt. %, about 0.01 wt. % to about 5 wt. %, or about 0.25 wt. % to about 2 wt. % of the SSQ-like particles. The EMI shielding composites may include, for example, about 5 wt. % or less, about 3 wt. % or less, about 1 wt. % or less, or even about 0.5 wt. % or less of the SSQ-like particles to exhibit desired EMI absorbing properties.

While not wanting to be bound by theory, it is believed that the added SSQ-like particles can cause intrinsic porosity in the composite and this may lead to lower values of real and imaginary parts (i.e., $\varepsilon'$ and $\varepsilon''$ values) of permittivity as compared to composites without the SSQ-like particles. The SSQ-like particles include Si—H groups that can produce hydrogen upon reacting with amines from a polymeric matrix material such as, for example, epoxy. The generation of hydrogen bubbles in the composite can cause the intrinsic porosity thereof.

The added SSQ-like particles are chemically compatible with the curable matrix material to be mixed therein. For example, viscosity of the curable matrix material can remain substantially unchanged upon mixing with the SSQ-like particle aggregates.

In some embodiments, the EMI shielding composites described herein can further include magnetic and/or dielectric fillers. The mixture of CNS fillers, SSQ-like particles, and other fillers can be dispersed in a curable matrix material to form EMI shielding composites. The composition of formed EMI shielding composites may include, for example, about 30 to about 90 wt. %, or about 50 to about 80 wt. % of magnetic and/or dielectric fillers. The magnetic fillers can include, for example, a ferromagnetic or ferrimagnetic material including doped or undoped carbonyl iron powder (CIP), iron silicide, ceramic magnetic ferrite, ceramic magnetic garnet, or combinations thereof. A suitable dispersant may be added during the mixing. The dielectric filler may include, for example, doped or undoped TiO, CuO, SiC, or mixtures thereof.

In some embodiments, the EMI shielding composites may further include, for example, about 30 to about 90 wt. %, or about 50 to about 80 wt. % of multiferroic fillers such as, for example, $BiFeO_3$, $BiMnO_3$, or mixtures thereof.

The present disclosure provides methods of producing EMI shielding composites including small amount of SSQ-like particles. The EMI shielding composites in the present disclose use carbon nanostructure (CNS) fillers as conductive fillers. The CNS fillers can include, for example, CNS encapsulated flakes or powders described above. The present disclosure further provides methods of adjusting properties of the EMI shielding composites by treating the CNS fillers. In some embodiments, the CNS fillers can be treated to at least partially remove the polymeric encapsulation material therefrom. It is to be understood that other suitable conductive fillers such as, for example, carbon black, carbon bubbles, carbon foams, carbon fibers, exfoliated graphite, graphene, graphene nano-platelets, metal nanoparticles, metal alloy particles, metal nanowires, conductive-coated particles, or a combination thereof etc., can also be used.

The CNS fillers provided herein can include a cross-linked network of carbon nanotubes and a polymeric encapsulation material. The CNS fillers can be, for example, CNS encapsulated flakes or powders that include a multitude of cross-linked and entangled carbon nanotubes and one or more polymeric encapsulation materials. The carbon nanotubes may be at least partially encapsulated by the one or more polymeric encapsulation materials. The CNS encapsulated flakes can be ground into fine powders with reduced dimensions or sizes without changing the microscopic structures.

In some embodiments, the CNS fillers can be treated to remove at least a portion of the polymeric encapsulation material. After the removal of the polymeric encapsulation material, the carbon nanotubes may be at least partially exposed. In some embodiments, 50 wt. % or more, 70 wt. % or more, 90 wt. % or more, 99 wt. % or more, or 99.9 wt. % or more of the polymeric encapsulation material may be removed from the CNS fillers. In some embodiments, the CNS fillers can be treated by a suitable solvent to dissolve and separate the respective polymeric encapsulation materials from the carbon nanotubes. In some embodiments, the polymeric encapsulation material may include polyethylene glycol (PEG), and the solvent may include water to dissolve the PEG encapsulation. In some embodiments, the polymeric encapsulation material may include polyurethane (PU) and the solvent may include N,N-Dimethylformamide (DMF) to dissolve the PU encapsulation. In some embodiments, the polymeric encapsulation material may include polyamide and the solvent may include ethanol to dissolve the polyamide encapsulation. It is to be understood that the polymeric encapsulation material may include other types of polymers, and one or more suitable solvents can be used to dissolve the respective polymeric encapsulation materials and thereby remove the polymeric encapsulation material from the CNS fillers. The method 100 then proceeds to 130.

In the present disclosure, SSQ-like particles are introduced to mix with the treated or untreated CNS fillers, and with other fillers if needed. The mixture was then added to a curable matrix material to obtain an electromagnetic interference (EMI) shielding composite. In some embodiments, the matrix material may include a curable polymer material such as, for example, epoxy, silicone, polycarbonate, polyester, polyurethane resin, etc. The EMI shielding composite can include, for example, 0.05 to 10 wt. %, 0.1 to 5 wt. %, or 0.25 to 2 wt. % of the CNS fillers. The CNS fillers can be dispersed in the curable matrix material with a density in the range, for example, from about 0.1 to about 25 $g/cm^3$, from about 0.3 to about 10 $g/cm^3$, or from about 0.5 to about 5.0 $g/cm^3$. In some embodiments, the CNS fillers can be uniformly dispersed in the curable matrix material to form a homogenous composite. In some embodiments, the CNS fillers can be unevenly dispersed in the curable matrix material. For example, a graded layer approach may be taken where the CNS fillers and/or other magnetic/dielectric fillers have a graded distribution so that the EMI composite is compositionally graded to reduce impedance mismatch between the EMI composite and free space. In some embodiments, other types of fillers including, for example, magnetic fillers, dielectric fillers, mixtures thereof, etc., can be mixed with the CNS fillers and the SSQ-like particles, and dispersed into the curable matrix material to achieve desired thermal, mechanical, electrical, magnetic, or dielectric properties.

For good absorber performance it is useful to lower the $\varepsilon'$ (real part of permittivity) values of an EMI composite so that it matches well with the values (real part of permeability) leading to electromagnetic (EM) impedance match and therefore lower reflection and enhanced absorber performance. For many dielectric absorbers that contain conductive particles it is a challenge to reduce reflection because the real part of permittivity values are rather high due to space charge polarization. One approach that was used is a graded layer approach where different layers of the composite has different filler concentration to improve EM impedance match and thereby improve absorber performance.

In the present disclosure, the introduction of SSQ-like particles in small amounts can lead to intrinsic porosity in the polymer matrix and this reduces the real part of permittivity values and thereby absorber performance is improved due to better impedance matching. This approach offers a straight forward way to improve absorber performance of EMI composites by introducing SSQ nanoparticles in the polymer matrix. It is to be understood that this approach is applicable to any suitable EMI composites including, for example, dielectric composites that contain conductive fillers such as carbon black, graphene, graphene nanoplatelets, carbon nanotubes, metal nanoparticles etc.

Some embodiments described herein further provide methods of modifying properties of EMI shielding composites by treating the CNS fillers to remove the polymeric encapsulation material therefrom before mixing with the SSQ-like particles. An original EMI shielding composite may include carbon nanostructure (CNS) fillers and a matrix material. The CNS fillers may include CNS encapsulated flakes or powders where cross-linked carbon nano tubes are encapsulated by one or more polymeric encapsulation materials. The CNS fillers can be mixed with a curable matrix material, and after curing, the original EMI shielding composite can be formed. To modify the EMI properties of the original EMI shielding composite, the CNS fillers can be treated with a solvent to remove at least a portion of the polymeric encapsulation material before dispersing into the curable matrix material and curing. The modified EMI shielding composite can include, for example, about 0.05 to about 10 wt. %, about 0.1 to about 5 wt. %, or about 0.2 to about 3 wt. % of the treated CNS fillers dispersed in the matrix material. In some embodiments, the modified EMI shielding composite can include, for example, about 5 wt. % or less, 3 wt. % or less, 2 wt. % or less, or even 1 wt. % or less of the treated CNS fillers.

The original EMI shielding composite has a first dielectric permittivity with a real part and an imaginary part. In some embodiments, the values of the imaginary part (s") of the first permittivity may be, for example, 5% or more, 10% or more, 20% or more, 30% or more, or 50% or more, higher than the values of the real part (s') of the first permittivity in the majority of the frequency range of 0.1 to 75 GHz. The modified EMI shielding composite has a second dielectric permittivity with a real part (s') and an imaginary part (s"). In some embodiments, the values of the imaginary part of the second permittivity may be, for example, 1% or more, 2% or more, 5% or more, or 10% or more, higher than the values of the real part of the second permittivity when the frequency is higher than a critical value. The values of the imaginary part of the second permittivity may be, for example, 1% or more, 5% or more, 10% or more, or 20% or more, lower than the values of the real part of the second permittivity when the frequency is lower than a critical value. The critical value can be in a frequency range of, for example, 3 to 20 GHz, or 5 to 15 GHz.

In some embodiments, the modified EMI shielding composite may have a relatively lower dielectric permittivity values than the original EMI shielding composite in a frequency range, for example, 0.1 to 100 GHz. In some embodiments, the values of dielectric permittivity of the modified composite may be, for example, 5% or more, 10% or more, 30% or more, 50% or more, 80% or more, or 100% or more, lower than the values of dielectric permittivity of the original composite. In some embodiments, the values of dielectric permittivity may decrease more in the lower end (e.g., 0.1 to 5 GHz) of the frequency range than in the higher end (e.g., 5 to 75 GHz).

The observed decrease of dielectric permittivity values for the modified EMI shielding composite in some embodiments is unexpected. It is well known in the literature that an electrically insulating polymer encapsulation material on a conductive filler will decrease the dielectric polarization and therefore show lower values of real and imaginary parts of permittivity (i.e., $\varepsilon'$ and $\varepsilon''$ values). See, for example, *High-k polymer/carbon nanotube composites based on a polyhedral oligomeric silsesquioxane matrix facilitated by ionic liquid*, J. Mater. Chem. C, 2014, 2, 8216, and *Effects of Nano-Alumina Hydrate Coating for Conductive Fillers on Dielectric Properties of Epoxy Composite Materials*, Proceedings of 2014 International Symposium on Electrical Insulating Materials (ISEIM), p 77-80, DOI:10.1109/ISEIM.2014.6870724. In the modified composites according to some embodiments, the removal of polymeric encapsulation material from the CNS fillers by treating the CNS fillers decreases the dielectric permittivity values of the composite including the treated CNS fillers.

The electromagnetic absorbing material described herein can be used in various ways. In some embodiment, the electromagnetic absorbing material can be applied as an EMI shield. The application may include at least one of molding, forming, and forming in place the electromagnetic absorbing material for use as the EMI shield. In some embodiments, the electromagnetic absorbing material can be formed as a composite sheet of absorbing material having a specific thickness. An adhesive material such as a pressure sensitive adhesive (PSA, e.g., made of curable or non-curable material) can be applied to at least one side of the sheet of absorbing material. In some embodiments, the EMI composite sheet can have a PSA backing that can be peeled off and the EMI absorber can then be glued on to the device for EMI protection. In some embodiments, instead of making composite sheets, molded parts (e.g., enclosures in some cases) including thermoplastic materials can be formed to shield sensitive microelectronic circuits.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

LISTING OF EXEMPLARY EMBODIMENTS

Exemplary embodiments are listed below. It is to be understood that any one of embodiments 1-20, 21-23, and 24-27 can be combined.

Embodiment 1 is an electromagnetic interference (EMI) shielding article having a composition comprising:
a plurality of electrically conductive fillers;
a plurality of silsesquioxane-like (SSQ-like) particles; and
a polymeric matrix material, the electrically conductive fillers and the SSQ-like particles being distributed inside the polymeric matrix material.

Embodiment 2 is the article of embodiment 1, wherein the composition is capable of absorbing at least a portion of the incoming electromagnetic (EM) energy in the base frequency range of 0.1-40 GHz and harmonics thereof.

Embodiment 3 is the article of embodiment 1 or 2, wherein the SSQ-like particles are capable of increasing EM energy absorption of the composition by at least 5% in the base frequency range of 0.1-40 GHz and harmonics thereof.

Embodiment 4 is the article of any one of embodiments 1-3, wherein the electrically conductive fillers comprise carbon nanostructure (CNS) fillers that include a plurality of cross-linked carbon nanotubes.

Embodiment 5 is the article of embodiment 4, wherein the CNS fillers further comprise one or more polymeric encapsulation materials, the carbon nanotubes being at least partially encapsulated by the polymeric encapsulation materials.

Embodiment 6 is the article of any one of embodiments 1-5, wherein the electrically conductive fillers further comprise carbon black, carbon bubbles, carbon foams, carbon fibers, carbon nanotubes, exfoliated graphite, graphene, graphene nanoplatelets, metal particles and nanoparticles, metal alloy particles, metal nanowires, conductive-coated particles, or a combination thereof.

Embodiment 7 is the article of any one of embodiments 1-6, wherein the SSQ-like particles are substantially free of —OH bonds, and the SSQ-like particles include Si—H groups capable of producing intrinsic porosity in the polymer matrix.

Embodiment 8 is the article of any one of embodiments 1-7, wherein the composition comprises about 25 wt. % or less of the SSQ-like particles.

Embodiment 9 is the article of any one of embodiments 1-8, wherein the ratio by weight of the polymeric matrix material and the SSQ-like particles is in a range from about 5 to about 5000.

Embodiment 10 is the article of any one of embodiments 1-9, wherein the composition comprises about 0.0005 to about 10 wt. % of the SSQ-like particles.

Embodiment 11 is the article of any one of embodiments 1-10, comprising about 0.001 to about 5 wt. % of the SSQ-like particles.

Embodiment 12 is the article of any one of embodiments 1-11, wherein the SSQ-like particles have an average dimension of about 10 nm to about 500 nm.

Embodiment 13 is the article of any one of embodiments 1-12, wherein the SSQ-like particles are present in the matrix material as particle aggregates having an average dimension of about one micron to about 10 microns.

Embodiment 14 is the article of any one of embodiments 1-13, comprising about 0.05 to about 10 wt. % of the electrically conductive fillers.

Embodiment 15 is the article of any one of embodiments 1-14, comprising about 0.1 to about 5 wt. % of the electrically conductive fillers.

Embodiment 16 is the article of any one of embodiments 1-15, comprising about 0.25 to about 2 wt. % of the electrically conductive fillers.

Embodiment 17 is the article of any one of embodiments 1-16, wherein the polymeric matrix material is a product of curing a curable matrix material including one or more of epoxy, silicone, polycarbonate, polyester, and polyurethane resin.

Embodiment 18 is the article of any one of embodiments 1-17, wherein the composition further comprises about 30 wt. % to about 90 wt. % of one or more magnetic fillers.

Embodiment 19 is the article of any one of embodiments 1-18, wherein the composition further comprises about 30 wt. % to about 90 wt. % of one or more dielectric fillers.

Embodiment 20 is the article of any one of embodiments 1-19, further comprising a moldable material.

Embodiment 21 is an electronic device comprising the article of any one of the preceding embodiments, wherein the electronic device further comprises a circuit, and the article is disposed adjacent the circuit.

Embodiment 22 is the electronic device of embodiment 21, wherein the article is attached to the circuit via an adhesive.

Embodiment 23 is the electronic device of embodiment 21 or 22, which is a mobile device.

Embodiment 24 is a method of making an EMI shielding article, the method comprising:
providing a plurality of electrically conductive fillers;
providing a plurality of silsesquioxane-like (SSQ-like) particles; and
adding a mixture of the electrically conductive fillers and the SSQ-like particles into a polymeric matrix material, the electrically conductive fillers and the SSQ particles being distributed inside the polymeric matrix material.

Embodiment 25 is the method of embodiment 24, wherein the electrically conductive fillers comprise carbon nanostructure (CNS) fillers that include a plurality of cross-linked carbon nanotubes.

Embodiment 26 is the method of embodiment 25, wherein the CNS fillers comprise a plurality of cross-linked carbon nanotubes and one or more polymeric encapsulation materials, the carbon nanotubes being at least partially encapsulated by the polymeric encapsulation materials, and the method further comprises treating the CNS fillers to remove at least a portion of the polymeric encapsulation materials from the CNS fillers before adding the mixture into the polymeric matrix material.

Embodiment 27 is the method of any one of embodiments 24-26, wherein removing the polymeric encapsulation materials comprises treating the CNS fillers in a solvent to dissolve and separate the polymeric encapsulation materials from the carbon nanotubes.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. In addition, Table 1 provides abbreviations and a source for all materials used in the Examples below:

TABLE 1

| Abbreviation | Description | Source |
| --- | --- | --- |
| CNS Encapsulated Flakes | flakes, about 70 microns long, 10 microns thick | Applied NanoStructured Solutions, LLC, Baltimore, MD |
| Epoxy | 2 part epoxy, Devcon 5 minute epoxy | ITW Devcon, Danvers, MA |
| CIP | carbonyl iron | BASF Corporation Evans |

TABLE 1-continued

| Abbreviation | Description | Source |
| --- | --- | --- |
| | powders, EW-I grade | City, PA |
| Collodial Silica | Powders | Nalco, Bedford Park, IL |
| Isoctyltrimethoxy silane | Liquid | Gelest, Morrisville, PA |
| Methyltrimethoxy silane | Liquid | Gelest, Morrisville, PA |
| Ethanol 80:20 | Liquid | EMD, Gibbstown, NJ |
| Methanel | Liquid | VWR, West Chester, PA |

Test Methods

The following test methods have been used in evaluating some of the Examples of the present disclosure. S parameters were obtained using an Agilent E8363C Network Analyzer from Agilent Technologies, Santa Clara, Calif., coupled with Model MO7T from Damaskos Inc., Concordville, Pa. Complex dielectric and magnetic properties were calculated over the frequency range of 0.1 to 18 GHz from the measured S parameters. Air Coax test fixture using the doughnut shaped samples at room temperature.

SSQ-Like Particles

SSQ-like particles were prepared by processes and materials described below. Sodium metasilicate pentahydrate (12.2 g) was dissolved in a 250 g solution of deionized water/acetone (50:50 wt. ratio) in a 2000 mL flask at 65° C. SYL-OFF 7048 (30.0 g) was added drop-wise to the flask with stirring. Evolution of gas with concomitant generation of froth and white precipitate was observed. After the complete addition of the SYL-OFF 7048, the reaction mixture was maintained at 65° C. and stirred for 2 hours with addition of acetone (20 mL, after about 15 minutes). After 2 hours, the stirring was stopped and the reaction mixture was filtered. The white residue (silsesquioxane-like nanoparticles) was washed thoroughly with an excess of deionized water. Drying of the solid was performed in an exhaust oven at 150° C. for 4 hours. "SYL-OFF 7048" is a 100 wt. % solids hydrosilyl-functional polysiloxane crosslinker (said to comprise methylhydrogen cyclosiloxane), 30 cSt., obtained from Dow Corning Corporation, Midland, Mich., under the trade designation "SYL-OFF 7048 CROSSLINKER"). Sodium metasilicate, sodium trimethylsilanolate, sodium hydroxide, and acetone were obtained from Sigma-Aldrich Chemical Company; Milwaukee, Wis. and used without further purification. The properties of the resulting product are summarized in Table 2, below.

TABLE 2

| Yield (%) | Average BET Surface Area (m$^2$/g) | Average Particle Size (nm) | % OH present |
| --- | --- | --- | --- |
| ≥90 | 94.2 | 50 | 0.1 |

Example 1A

CNS encapsulated flakes commercially available from Applied NanoStructured Solutions, LLC, Baltimore, Md., were ground to fine powders using mortar and pestle under dry conditions at room temperature. The CNS encapsulated flakes or powders include about 4 wt. % of polymeric encapsulation material, polyethylene glycol (PEG) in this case, and about 96 wt. % of cross-linked carbon nanostructures. The fine powders of CNS encapsulated flakes were put in a solvent (water in this case), stirred with magnetic bars on a hotplate at 110° C. to dissolve the PEG encapsulation and dried to isolate the CNS flake powders. The solvent-treated CNS flake powders were mixed with CIP powders (Carbonyl Iron, commercially available from BASF) in a plastic jar. About 1.0 wt. % dispersant (5 nm hydrophobic nanosilica) and 3.5 wt. % Silsesquioxane-like (SSQ-like) nanoparticle powders were added into the mixture using dry speed mixing technique.

The nanosilica dispersant was prepared as follows. A mixture of 100 grams of colloidal silica (16.06 wt. % solids in water; 5 nm size), 7.54 grams of isoctyltrimethoxy silane, 0.81 grams of methyltrimethoxysilane and 112.5 grams of an 80:20 wt. % solvent blend of ethanol:methanol were added to a 500 ml 3-neck round bottom flask (Ace Glass, Vineland, N.J.). The flask containing the mixture was placed in an oil bath set at 80° C. with stirring for 4 hours to prepare hydrophobically modified nanosilica particles. The hydrophobically modified nanosilica particles were transferred to a crystallizing dish and dried in a convection oven at 150° C. for 2 hours.

The final mixture of treated CNS encapsulated flake powders, SSQ-like nanoparticles, CIP powders, and the dispersant was added to epoxy (Devcon 5 minute epoxy commercially available from ITW Devcon, Danvers, Mass.), put in a speed mixer (DAC 150 FVZ, Siemens) and spun at rpm=2000 for 2 minutes) to form a composite sample. The mixture was cured at room temperature for 4 hours. When the epoxy composite was completely cured, the composite was taken out of the plastic jar (used as a mold). The composite includes about 0.7 wt. % of the solvent-treated CNS encapsulated flake powders, about 70 wt. % of the CIP powders, about 3.5 wt. % of the SSQ-like nanoparticles, about 25.1 wt. % of the epoxy, and about 0.7 wt. % of the dispersant (nanosilica). The composite sample was then machined into toroid or doughnut shaped samples with an outer diameter of 0.275 inch (0.70 cm), an inner diameter of 0.120 inch (0.30 cm), and a thickness of about 3-6 mm, for electromagnetic measurements.

Example 1B

Example 1B was made the same way as Example 1A except that no SSQ-like particles were added. The composite includes about 0.7 wt. % of the solvent-treated CNS encapsulated flake powders, about 70 wt. % of the CIP powders, about 28.6 wt. % of the epoxy, and about 0.7 wt. % of the dispersant (nanosilica).

Figure 2A:
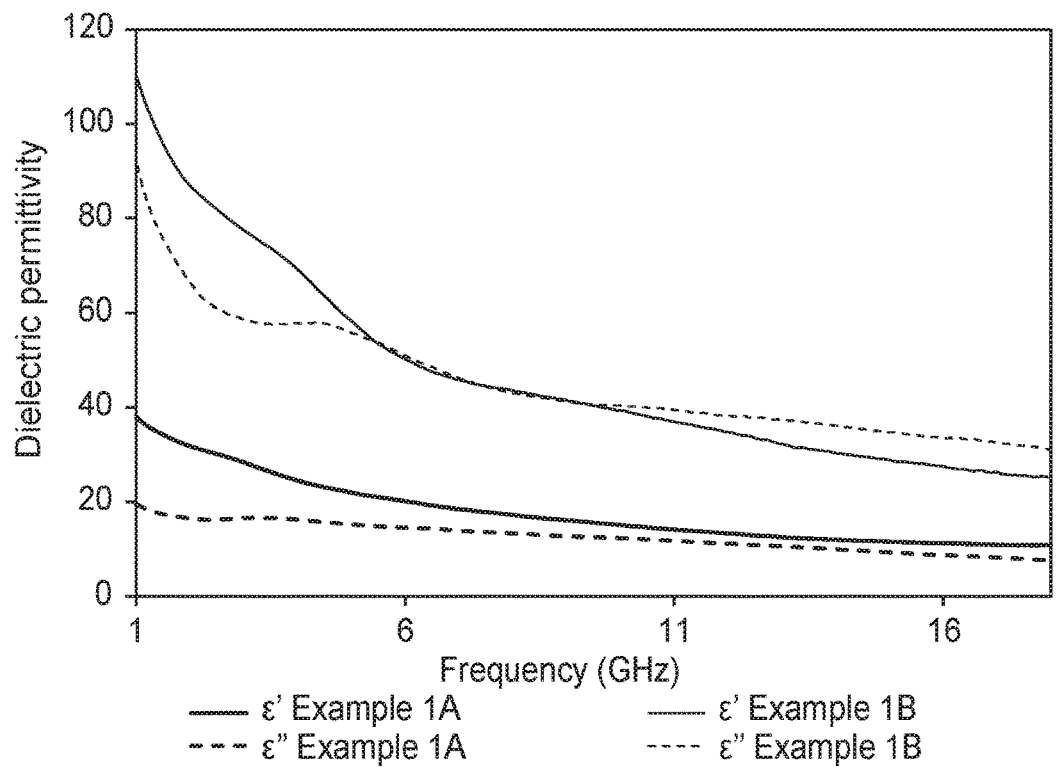
FIG. 2A illustrates test results for Examples 1A-B showing plots for real and imaginary parts of dielectric permittivity of polymer composite versus frequency.
Figure 2B:
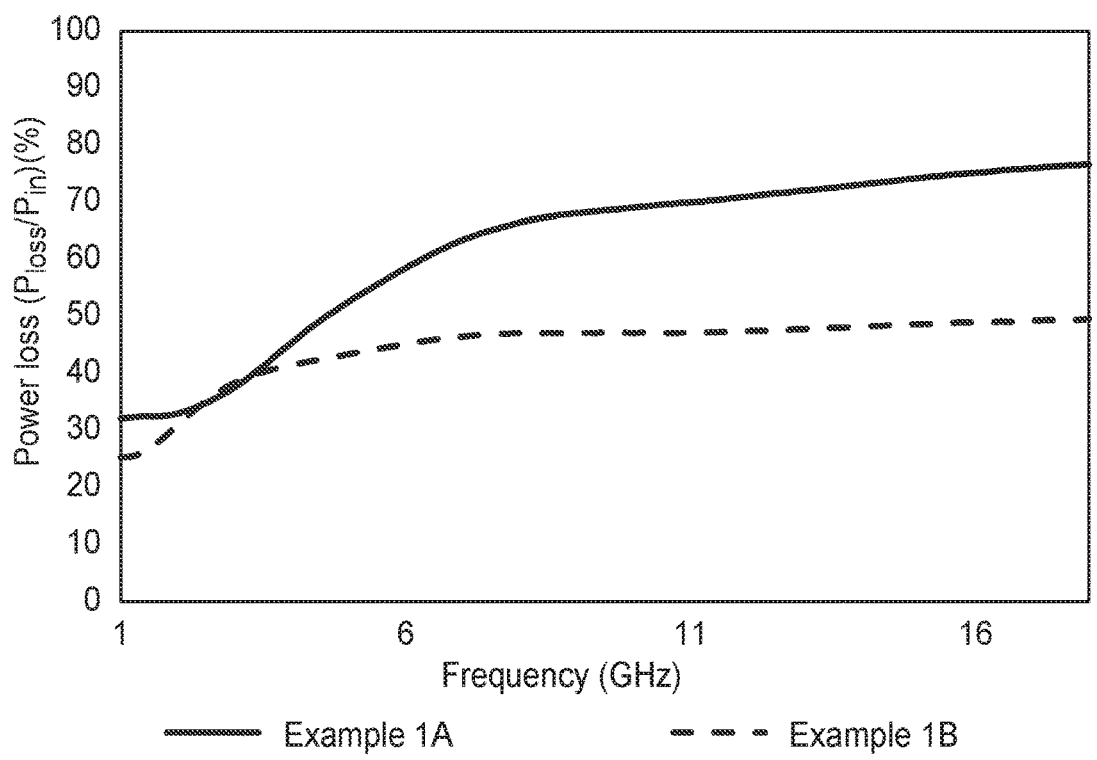
FIG. 2B illustrates test results for Examples 1A-B showing plots for electromagnetic (EM) power absorbed by polymer composite versus frequency.

FIGS. 2A-B illustrate test results for Examples 1A and 1B. As shown in FIG. 2A, the composite of Example 1B shows relatively higher values of real and imaginary part of permittivity ($\epsilon'$ and $\epsilon''$ values). Even when the loading of CNS encapsulated flakes is very low (e.g., about 0.7 wt. %), the composite of Example 1B shows enhanced permittivity values in the higher frequency range. At higher frequency ranges (e.g., f>6 GHz), the $\epsilon''$ values (dielectric loss) are higher than $\epsilon'$ values. However under certain conditions, the high $\epsilon'$ (real part of permittivity) values may cause high EM reflection which will decrease the absorber performance of the composite. The conductive filler composites also exhibit classic frequency dispersion characteristics where the ($\epsilon'$ and $\epsilon''$) values change with frequency which is typical of conductive fillers in an insulating matrix displaying space charge polarization.

FIG. 2A also shows the dielectric characteristics of the composite of Example 1A which includes 3.5 wt. % of the SSQ-like particles. Example 1A shows much lower values of $\epsilon'$ and $\epsilon''$ compared to Example 1B. Introduction of the SSQ-like nanoparticles may cause intrinsic porosity (e.g., due to generation of $H_2$ gas bubbles) in the composite of Example 1A and this may lead to lower values of ε' and ε". Dielectric loss (ε") values are still high but the real part of permittivity (ε') values are lower compared to Example 1B which contains no SSQ-like nanoparticles. This implies that absorber performance of the composite of Example 1A can be superior to the absorber performance of the composite without SSQ-like nanoparticles (Example 1B).

In FIG. 2B, the EM absorber performance (power absorbed or loss) versus frequency is plotted for Example 1A (with SSQ-like particles) and Example 1B (without SSQ-like particles), respectively. Example 1A exhibits enhanced absorber performance (up to about 30%) in the frequency range of about 4 GHz to about 18 GHz and beyond compared to Example 1B.

Example 1A also exhibits frequency dispersion characteristics that are relatively subdued as compared to Example 1B. In FIG. 2A, the ε' and ε" values of Example 1B (without SSQ-like particles) varies from about 110 to about 25 (variation of about 77%) and from about 90 to about 35 (variation of about 61%) respectively, in the frequency range of 1-18 GHz. In contrast, the ε' and ε" values of Example 1A (with the SSQ-like particles) varies from about 40 to about 18 (variation of about 55%) and from about 20 to about 12 (variation of about 40%) respectively, in the same frequency range of 1-18 GHz. This subdued frequency dependence of dielectric polarization, as shown in Example 1B, is useful for some applications where flat band characteristics of EMI/EMC absorbers across the frequency spectrum are preferred.

Example 2A

CNS encapsulated flakes commercially available from Applied NanoStructured Solutions, LLC, Baltimore, Md., were ground to fine powders using mortar and pestle under dry conditions at room temperature. The CNS encapsulated flakes or powders include about 4 wt. % of polymeric encapsulation material, polyurethane (PU) in this case, and about 96 wt. % of cross-linked carbon nanostructures.

A stoichiometric amount of the fine powders of CNS encapsulated flakes were then mixed with silsesquioxane-like (SSQ-like) particle powders (about 0.02 wt. %) and mixed with the host polymer matrix epoxy (Devcon 5 minute epoxy from ITW Devcon, Danvers, Mass.) in a small plastic jar and put in a speed mixer (DAC 150 FVZ, Siemens, spun at rpm=2000 for 2 mins.). The mixture was cured at room temperature for 4 hours. The composite includes about 0.28 wt. % of the CNS encapsulated flake powders, about 0.02 wt. % of the SSQ-like nanoparticles, and about 99.7 wt. % of the epoxy.

When the epoxy composite was completely cured, the composite mixture was taken out of the plastic jar (used as a mold). The composite sample was then machined into toroid or doughnut shaped sample (outer diameter=0.275 inch (0.70 cm) and inner diameter=0.120 inch (0.30 cm), thickness=3-6 mm) samples for electromagnetic co-axial measurements.

Example 2B

Example 2B was made the same way as Example 2A except that no SSQ-like particles were added. The composite includes about 0.28 wt. % of the CNS encapsulated flake powders, and about 99.72 wt. % of the epoxy.

Figure 3:
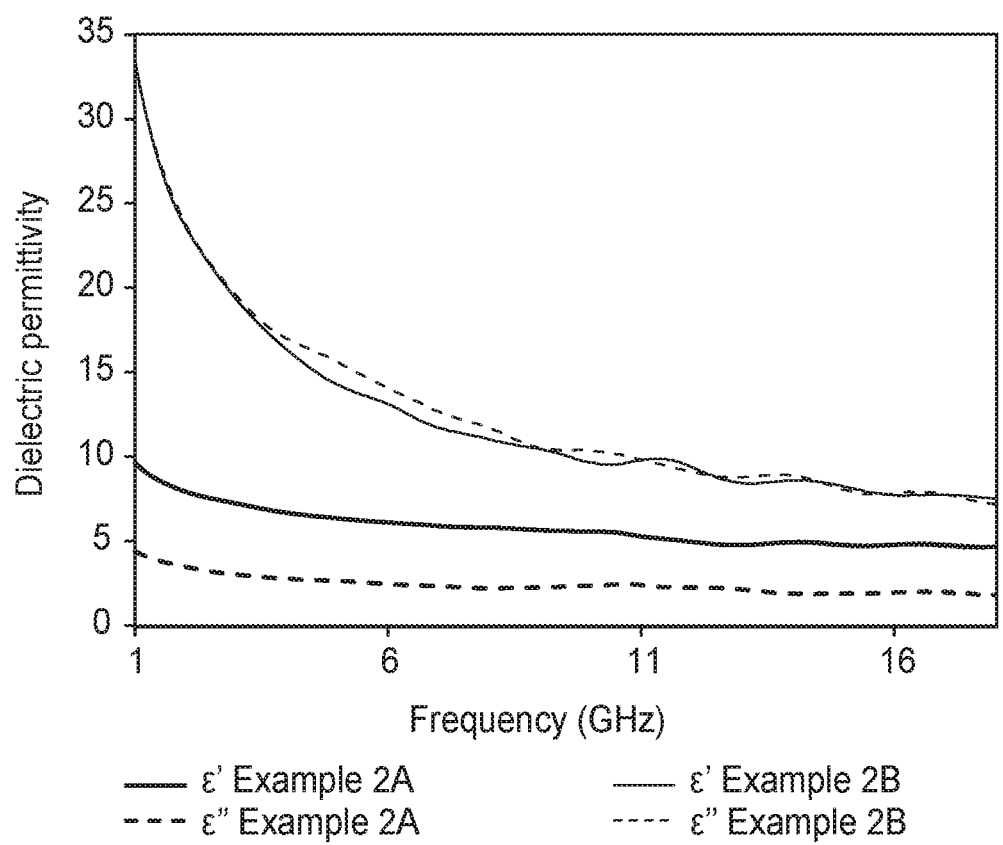
FIG. 3 illustrates test results for Examples 2A-B showing plots for real and imaginary parts of dielectric permittivity of polymer composite versus frequency.

FIG. 3 shows that with very low concentrations of CNS fillers (about 0.28 wt. %), in the epoxy matrix, Example 2B exhibits very high degree of dielectric polarization leading to high values of real (ε') and imaginary (ε") part of permittivity. While the dielectric loss (ε" values) is high the real part (ε' values) of permittivity is also high which means that reflection loss may be high. Thus there is scope of improvement as far as EMI absorber performance is concerned for Example 2B.

FIG. 3 also shows the dielectric characteristics of Example 2A that contains about 0.02 wt. % SSQ-like particles that can cause intrinsic porosity in the matrix. Example 2A exhibits relatively lower values of real part (ε' values) of permittivity and lower refection coefficient, and thereby provides enhanced EMI absorber performance.

Also similar to the results in Example 1A, by adding small amount of the SSQ-like particles, the frequency dispersion characteristics of Example 2A are subdued which might be beneficial for some EMI applications where flat band characteristics of EMI/EMC absorbers across the frequency spectrum are preferred.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about." Furthermore, various exemplary embodiments have been described. These and other embodiments are within the scope of the following claims.

What is claimed is:

1. An electromagnetic interference (EMI) shielding article having a composition comprising:
   a plurality of electrically conductive fillers;
   a plurality of silsesquioxane-like (SSQ-like) particles; and
   a polymeric matrix material, the electrically conductive fillers and the SSQ-like particles being distributed inside the polymeric matrix material,
   wherein the composition comprises about 0.0005 wt. % to about 2 wt. % of the SSQ-like particles, and
   wherein the SSQ-like particles are present in the matrix material as particle aggregates having an average dimension from about one micron to about 10 microns.

2. The article of claim 1, wherein the composition is capable of absorbing at least a portion of the incoming electromagnetic (EM) energy in a base frequency range of 0.1 to 40 GHz and harmonics thereof.

3. The article of claim 2, wherein the SSQ-like particles are capable of increasing EM energy absorption of the composition by at least 5%.

4. The article of claim 1, wherein the electrically conductive fillers comprise carbon nanostructure (CNS) fillers that include a plurality of cross-linked carbon nanotubes.

5. The article of claim 4, wherein the CNS fillers further comprise one or more polymeric encapsulation materials, and the carbon nanotubes are at least partially encapsulated by the polymeric encapsulation materials.

6. The article of claim 1, wherein the electrically conductive fillers further comprise carbon black, carbon bubbles, carbon foams, carbon fibers, carbon nanotubes, exfoliated graphite, graphene, graphene nanoplatelets, metal particles and nanoparticles, metal alloy particles, metal nanowires, conductive-coated particles, or a combination thereof.

7. The article of claim 1, wherein the SSQ-like particles include Si—H groups capable of producing intrinsic porosity in the polymer matrix.

8. The article of claim 1, wherein the ratio by weight of the polymeric matrix material and the SSQ-like particles is in a range from about 5 to about 5000.

9. The article of claim 1, comprising about 0.001 to about 1 wt. % of the SSQ-like particles.

10. The article of claim 1, wherein the SSQ-like particles have an average dimension of about 10 nm to about 500 nm.

11. An electronic device comprising the article of claim 1, wherein the electronic device further comprises a circuit, and the article is disposed adjacent the circuit to provide EMI protection.

12. The electronic device of claim 11, which is a mobile device.

13. The article of claim 1, wherein the polymeric matrix material is a product of curing a curable matrix material including at least one of epoxy, silicone, polycarbonate, polyester, or polyurethane resin.

14. A method of making an electromagnetic interference (EMI) shielding article, the method comprising:

providing a plurality of electrically conductive fillers;
providing a plurality of silsesquioxane-like (SSQ-like) particles; and
adding a mixture of the electrically conductive fillers and the SSQ-like particles into a polymeric matrix material, the electrically conductive fillers and the SSQ-like particles being distributed inside the polymeric matrix material,
wherein the composition comprises about 0.0005 wt. % to about 2 wt. % of the SSQ-like particles, and
wherein the SSQ-like particles are present in the matrix material as particle aggregates having an average dimension from about one micron to about 10 microns.

15. The method of claim 14, wherein the electrically conductive fillers comprise carbon nanostructure (CNS) fillers that include a plurality of cross-linked carbon nanotubes.

16. The method of claim 15, wherein the CNS fillers comprise a plurality of cross-linked carbon nanotubes and one or more polymeric encapsulation materials, the carbon nanotubes being at least partially encapsulated by the polymeric encapsulation materials, and the method further comprises treating the CNS fillers to remove at least a portion of the polymeric encapsulation materials from the CNS fillers before adding the mixture into the polymeric matrix material.

17. The method of claim 16, wherein removing the polymeric encapsulation materials comprises treating the CNS fillers in a solvent to dissolve and separate the polymeric encapsulation materials from the carbon nanotubes.

18. The method of claim 14, wherein the polymeric matrix material is a product of curing a curable matrix material including at least one of epoxy, silicone, polycarbonate, polyester, or polyurethane resin.

19. The method of claim 14, further comprising reacting the SSQ-like particles with the polymeric matrix to produce intrinsic porosity in the polymer matrix.

* * * * *